(12) United States Patent
Chen

(10) Patent No.: US 8,324,701 B2
(45) Date of Patent: Dec. 4, 2012

(54) IMAGE SENSORS

(75) Inventor: Po-Shuo Chen, Taipei County (TW)

(73) Assignee: VisEra Technologies Company Limited, Hsinchu Science Park (TW)

( * ) Notice: Subject to any disclaimer, the term of this patent is extended or adjusted under 35 U.S.C. 154(b) by 95 days.

(21) Appl. No.: 12/837,637

(22) Filed: Jul. 16, 2010

(65) Prior Publication Data

US 2012/0012959 A1 Jan. 19, 2012

(51) Int. Cl.
*H01L 31/0232* (2006.01)

(52) U.S. Cl. .................. 257/432; 257/435; 257/E31.127

(58) Field of Classification Search .................. 257/291, 257/292, 294, E133, E27.133, 432, 435, E31.127
See application file for complete search history.

(56) References Cited

U.S. PATENT DOCUMENTS

| | | | | |
|---|---|---|---|---|
| 5,537,232 A * | 7/1996 | Biles | ................................. | 359/15 |
| 7,659,136 B2 * | 2/2010 | Maeda et al. | ................... | 438/73 |
| 7,683,411 B2 * | 3/2010 | Moon | ........................... | 257/294 |
| 7,709,871 B2 * | 5/2010 | Hwang | ......................... | 257/292 |
| 8,075,810 B2 * | 12/2011 | Kawasaki | ...................... | 264/1.7 |
| 8,183,080 B2 * | 5/2012 | Park | ................................. | 438/70 |
| 2010/0044819 A1 * | 2/2010 | Jeong et al. | .................. | 257/432 |
| 2010/0182474 A1 * | 7/2010 | Mingam et al. | ............... | 348/308 |
| 2011/0123929 A1 * | 5/2011 | Fujita et al. | ................ | 430/281.1 |

* cited by examiner

*Primary Examiner* — Tuan N. Quach

(74) *Attorney, Agent, or Firm* — Muncy, Geissler, Olds & Lowe, PLLC

(57) ABSTRACT

An image sensor is provided. The image sensor includes a pixel sensor, a color filter array comprising a plurality of color filters formed on the pixel sensor, wherein two adjacent color filters have a gap therebetween, and a gapless microlens array comprising a plurality of microlenses formed on the color filter array. The invention also provides a method for fabricating the image sensor.

10 Claims, 5 Drawing Sheets

IMAGE SENSORS

BACKGROUND OF THE INVENTION

1. Field of the Invention

The invention relates to an image sensor, and more particularly to an image sensor with a disconnected color filter structure and fabrication method thereof.

2. Description of the Related Art

An image sensor, as a kind of semiconductor device, transforms optical images into electrical signals. Image sensors can be generally classified into charge coupled devices (CCDs) and complementary metal oxide semiconductor (CMOS) image sensors. Among these image sensors, a CMOS image sensor comprises a photodiode for detecting incident light and transforming it into electrical signals, and logic circuits for transmitting and processing the electrical signals.

A conventional method for manufacturing a CMOS image sensor comprising microlenses is hereinafter described referring to FIGS. 1A to 1C.

First, referring to FIG. 1C, a conventional CMOS image sensor is provided. The CMOS image sensor comprises a light sensing part 13 comprising a photodiode 11 for accepting incident light, and for generating and accumulating electric charges, a protecting layer 21 formed on a structure of the light sensing part 13, a color filter array 23, and a plurality of microlenses 27.

In a conventional method of manufacturing such a structured CMOS image sensor, as shown in FIG. 1A, the protecting layer 21 with a silicon nitride base is formed on a semiconductor substrate 10 that comprises the light sensing part 13 comprising the photodiodes 11. Then, as shown in FIG. 1B, the color filter array 23 (with a connected color filter structure) is formed on the protecting layer 21. Here, the color filter array 23 is formed in a primary color system, i.e., comprising a red filter (R), a green filter (G), and a blue filter (B), using photoresist materials containing a red, green, or blue pigment, respectively. Formation of each color filter involves a series of coating, exposure and development processes according to photolithography techniques. Alternatively, the color filter array 23 can be formed in a complementary color system comprising cyan, yellow, and magenta filters.

Then, as shown in FIG. 1C, a photoresist layer is applied, exposed, and developed on the color filter array 23; thus forming a plurality of photoresist patterns. These photoresist patterns are then thermally reflowed and cured to form lenses; thus resulting in a plurality of microlenses 27.

According to the conventional method, the microlenses 27 are formed with a distant from each other by about 0.2 μm to 0.5 μm (due to the connected color filter structure), for the purpose of preventing formation of bridges between the microlenses 27 during the curing and reflowing processes of corresponding photoresist patterns. However, a gap between the microlenses 27 results, such that at least some light incident between the microlenses 27 is loss, and resolution of color signals may be decreased to a level that is less than optimal due to oblique light incident to adjacent pixels.

Additionally, the microlenses 27 are formed by a coating, photolithography and thermal process. Thus, the materials of the microlenses 27 are limited to only photo type materials.

BRIEF SUMMARY OF THE INVENTION

One embodiment of the invention provides an image sensor comprising a pixel sensor, a protecting layer formed on the pixel sensor, a color filter array comprising a plurality of color filters formed on the protecting layer, wherein two adjacent color filters have a gap therebetween (e.g., a disconnected color filter structure), and a gapless microlens array comprising a plurality of microlenses formed on the color filter array.

The protecting layer comprises silicon nitride. The color filter in the plurality of color filters comprises a first gap along a row direction, a second gap along a column direction and, a third gap along a diagonal direction. The first gap is similar to the second gap. The third gap is larger than the first gap and the third gap is larger than the second gap. The color filter is polygonal or rectangular. The microlens comprises photoresist or thermoplastic resins. The microlens on the color filter has a height determined by the first gap, the second gap and the third gap. The microlens has a slope determined by the first gap, the second gap and the third gap.

In the disclosed image sensor, the disconnected color filter structure improves light sensitivity to and condensing efficiency of incident light. Since the light sensitivity can be improved and an oblique light incident to adjacent pixels can be reduced or prevented, it is possible to realize clearer images using an image sensor, for example a CMOS image sensor, manufactured according to the invention.

One embodiment of the invention provides a method for fabricating an image sensor comprising providing a pixel sensor, forming a protecting layer on the pixel sensor, forming a color filter array comprising a plurality of color filters on the protecting layer, wherein two adjacent color filters have a gap therebetween, coating a transparent material on the color filter array, and hardening the transparent material to form a gapless microlens array comprising a plurality of microlenses.

The protecting layer comprises silicon nitride. The color filter array is formed by a photolithography process. The color filter in the plurality of color filters comprises a first gap along a row direction, a second gap along a column direction and a third gap along a diagonal direction. The first gap is similar to the second gap. The third gap is larger than the first gap and the third gap is larger than the second gap. The transparent material comprises photoresist or thermoplastic resins. The transparent material is hardened by a thermal reflow and curing process. The microlens on the color filter has a height determined by the first gap, the second gap and the third gap. The microlens on the color filter has a slope determined by the first gap, the second gap and the third gap.

In the disclosed fabrication method, a gapless microlens array is formed by mere coating and a thermal process without an additional photolithography process. Thus, the materials of the microlenses are not limited to photo type materials. Alternatively, non-photo type materials may also be used, improving process window. Additionally, in accordance with various process requirements (for example formation of various distances from the microlens to the diode), the microlens profile (e.g., height and curve) may be easily altered by adjusting the gap size.

One embodiment of the invention provides an image sensor comprising a pixel sensor, a color filter array comprising a plurality of color filters formed on the pixel sensor, wherein two adjacent color filters have a gap therebetween and the color filter in the plurality of color filters comprises a first gap along a row direction, a second gap along a column direction and a third gap along a diagonal direction, and a gapless microlens array comprising a plurality of microlenses formed on the color filter array, wherein the microlens on the color filter has a height and a slope determined by the first gap, the second gap and the third gap.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein:

FIG. 2B' is a top view of FIG. 2B.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

One embodiment of an image sensor according to the invention is described with reference to FIGS. 2D and 2B'.

Figure 1A:
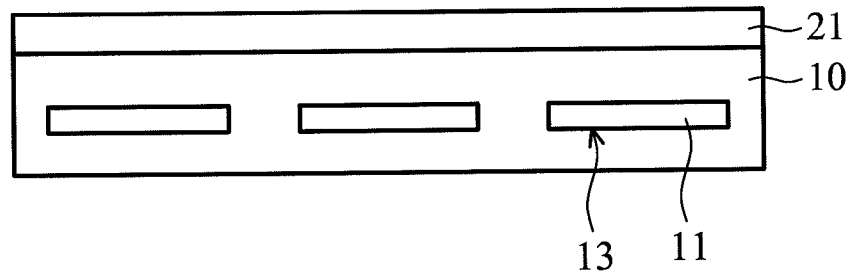
FIGS. 1A to 1C are cross-sectional views illustrating a conventional method for manufacturing a CMOS image sensor.
Figure 1B:
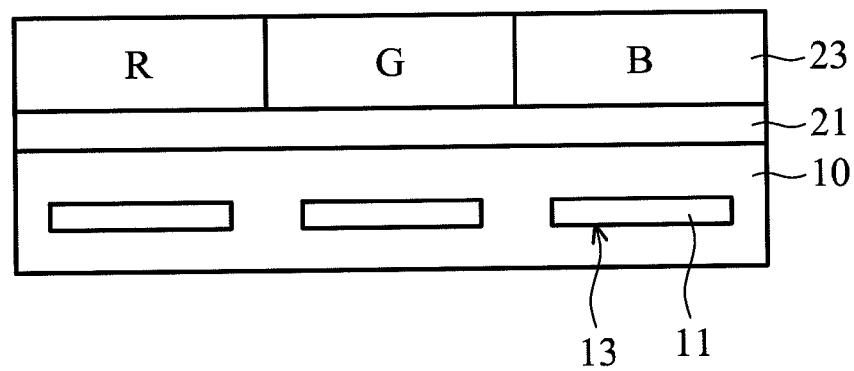
Figure 1C:
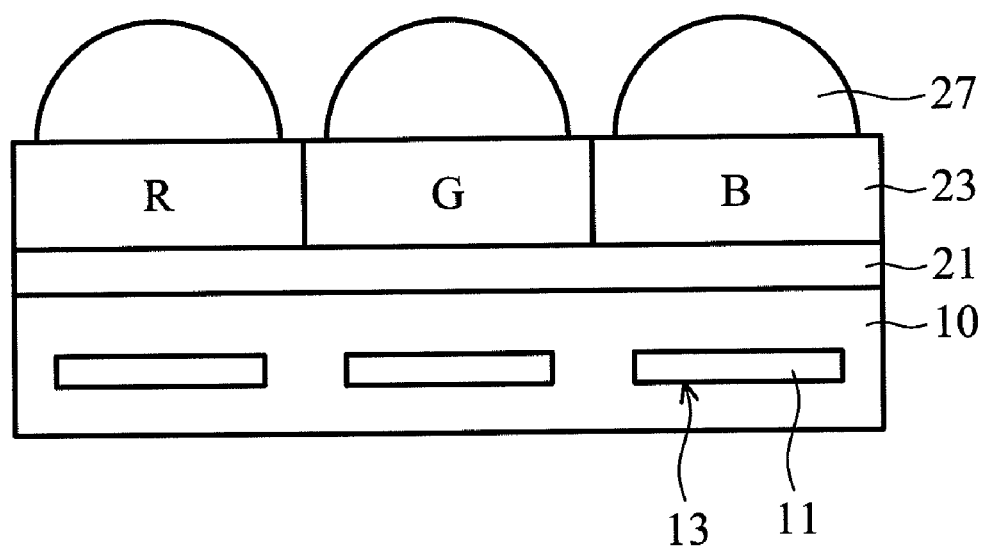
Figure 2A:
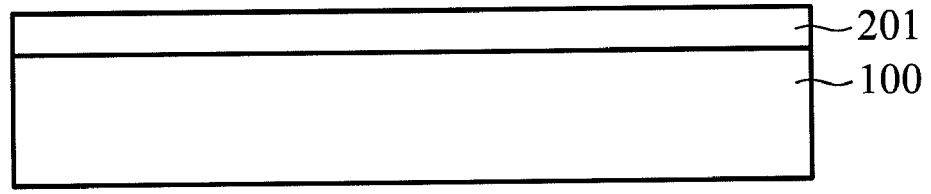
FIGS. 2A to 2D are cross-sectional views illustrating one embodiment of a method for manufacturing an image sensor according to the invention.
Figure 2B:
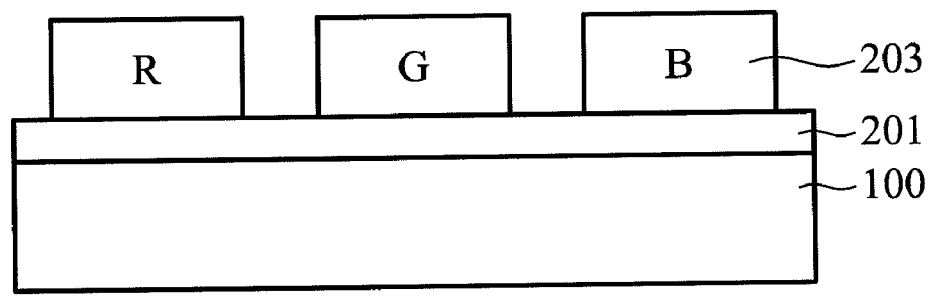
Figure 2B:
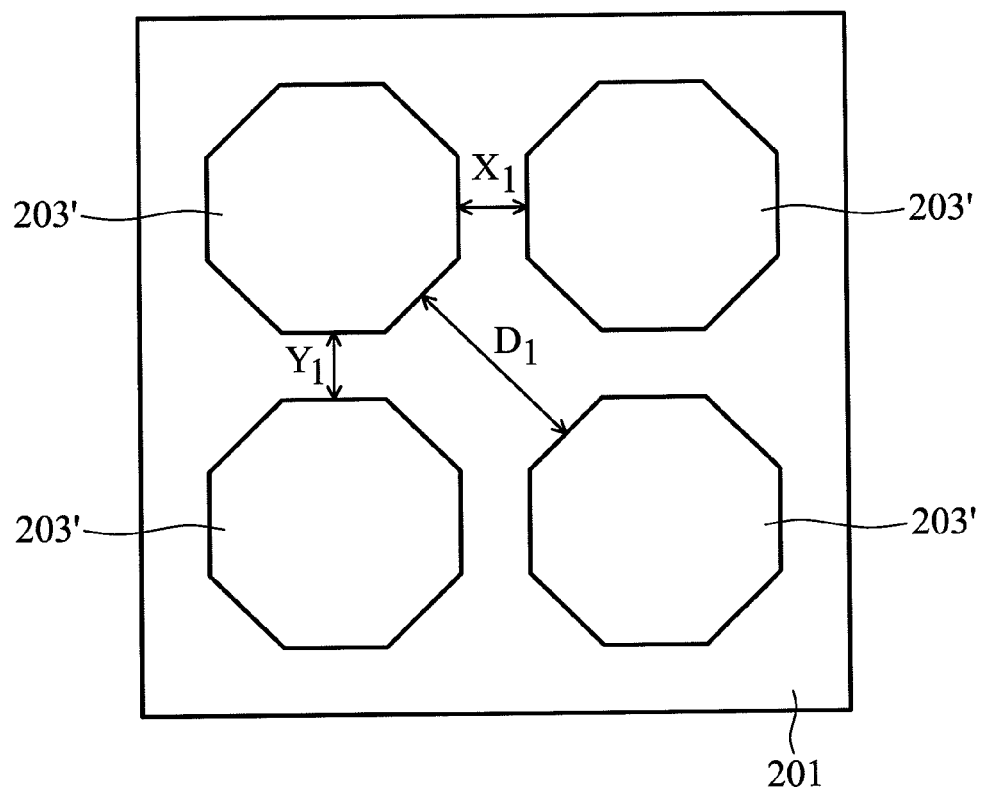
Figure 2C:
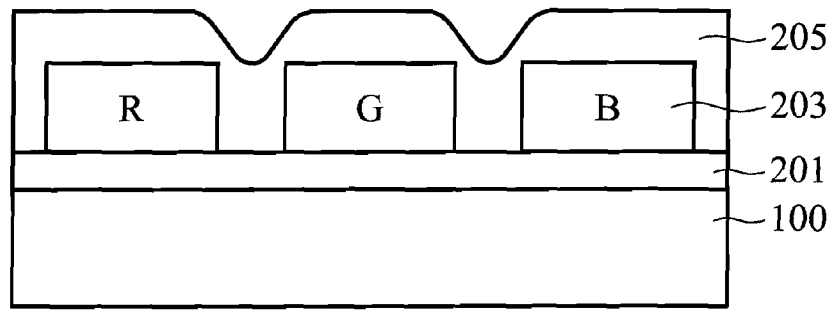
Figure 2D:
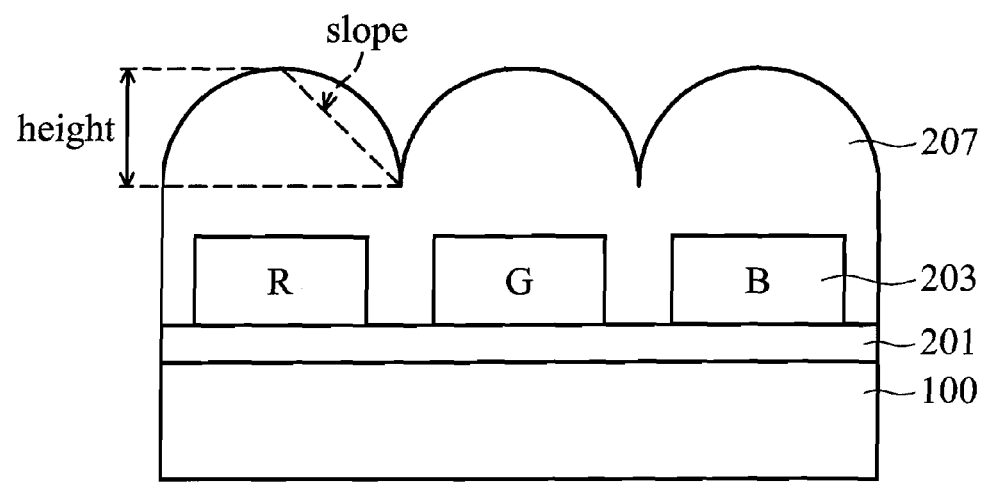

Referring to FIG. 2D, an image sensor comprises a pixel sensor 100, a protecting layer 201, a color filter array 203 comprising a plurality of color filters and a gapless microlens array 207 comprising a plurality of microlenses. The protecting layer 201 is formed on the pixel sensor 100. The color filter array 203 is formed on the protecting layer 201. The gapless microlens array 207 is formed on the color filter array 203. Specifically, in the color filter array 203, two adjacent color filters 203' have a gap ($X_1$, $Y_1$ and $D_1$) therebetween (e.g., a disconnected color filter structure), as shown in FIG. 2B'.

The protecting layer 201 may comprise silicon nitride. The gap $X_1$ between two adjacent color filters 203' along a row direction is substantially similar to the gap $Y_1$ between two adjacent color filters 203' along a column direction in the color filter array 203. The gap $D_1$ between two adjacent color filters 203' along a diagonal direction is substantially larger than the gap $X_1$ between two adjacent color filters 203' along a row direction or the gap $Y_1$ between two adjacent color filters 203' along a column direction in the color filter array 203. The color filter 203' is alternatively polygonal or rectangular. For instance, determination of the gap $D_1$, is dependent upon such polygonal color filters. The color filter array 203 may comprise a primary color system, i.e., comprising a red filter (R), a green filter (G), and a blue filter (B). Alternatively, the color filter array 203 may comprise a complementary color system comprising cyan, yellow, and magenta filters. The microlens may comprise photoresist or thermoplastic resins. The microlens has a height substantially determined by the sizes of the gaps $X_1$, $Y_1$ and $D_1$. The microlens has a curve substantially determined by the sizes of the gaps $X_1$, $Y_1$ and $D_1$.

In the disclosed image sensor, the disconnected color filter structure improves light sensitivity to and condensing efficiency of incident light. Since the light sensitivity can be improved and an oblique light incident to adjacent pixels can be reduced or prevented, it is possible to realize clearer images using an image sensor, for example a CMOS image sensor, manufactured according to the invention.

Hereinafter, one embodiment of a manufacturing method for a CMOS image sensor according to the invention is described with reference to FIGS. 2A to 2D.

Referring to FIG. 2A, a protecting layer 201 with a silicon nitride base (e.g., which may comprise silicon nitride) is formed on a pixel sensor 100.

Next, as shown in FIG. 2B, a color filter array 203 comprising a plurality of color filters is formed on the protecting layer 201. Here, the color filter array 203 may comprise a primary color system, i.e., comprising a red filter (R), a green filter (G), and a blue filter (B), using a photoresist material containing a red, green, and blue pigment, respectively. Formation of each color filter may involve performing, at least three times, the photolithography process, which comprises coating, exposure and development of each individual photoresist material. Alternatively, the color filter array 203 is formed by methods such as inject printing. Specifically, in the color filter array 203, two adjacent color filters form a gap therebetween, such as, formation of the disconnected color filter structure, as shown in FIG. 2B'. FIG. 2B' is a top view of FIG. 2B. In FIG. 2B', the gap between two adjacent color filters 203' along a row direction represents $X_1$ gap. The gap between two adjacent color filters 203' along a column direction represents $Y_1$ gap. The gap between two adjacent color filters 203' along a diagonal direction represents $D_1$ gap. Alternatively, $X_1$ gap is similar to $Y_1$ gap. $D_1$ gap is larger than $X_1$ gap and $Y_1$ gap. Additionally, the color filters 203' are alternatively polygonal or rectangular. For instance, determination of the gap $D_1$, is dependent upon such polygonal color filters facilitate. This embodiment exemplifies the primary color filter system, however, the color filter array 203 can be alternatively formed in a complementary color system comprising cyan, yellow, and magenta filters.

Next, a transparent material 205 is coated on the color filter array 203, as shown in FIG. 2C. Then, as shown in FIG. 2D, the transparent material 205 is hardened, for example by a thermal reflow and curing process, to form lenses having a desired curvature; thus resulting in a microlens array 207 comprising a plurality of microlenses. The formed microlens array 207 is gapless due to the disconnected color filter structure. In the microlens formation process, no photolithography process is required. Thus, in addition to photo type materials such as photoresist, non-photo type materials such as thermoplastic resins may be alternatively used. Furthermore, in order to meet the thermal reflow property, any thermal flowable materials with a melting point of about 120 to 180° C. are appropriate for use as the transparent material 205. Additionally, the microlens 207 has a height substantially determined by the sizes of $X_1$, $Y_1$ and $D_1$ gaps. The microlens 207 has a curve substantially determined by the sizes of $X_1$, $Y_1$ and $D_1$ gaps.

In the disclosed fabrication method, the gapless microlens array is formed by a mere coating and a thermal process without an additional photolithography process. Thus, the materials of the microlenses are not limited to photo type materials. Alternatively, non-photo type materials may also be used, improving process window. Additionally, in accordance with various process requirements (for example formation of various distances from the microlens to the diode), the microlens profile (e.g., height and curve) may be easily altered by adjusting the gap size.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An image sensor, comprising:
   a pixel sensor;
   a color filter array comprising a plurality of color filters formed on the pixel sensor, wherein two adjacent color filters have a gap therebetween; and
   a gapless microlens array of a transparent material comprising a plurality of microlenses formed on the color filter array and the transparent material filled into the gap.

2. The image sensor as claimed in claim 1, wherein the color filter in the plurality of color filters comprises a first gap along a row direction, a second gap along a column direction and a third gap along a diagonal direction.

3. The image sensor as claimed in claim 2, wherein the first gap is similar to the second gap.

4. The image sensor as claimed in claim 2, wherein the third gap is larger than the first gap and the third gap is larger than the second gap.

5. The image sensor as claimed in claim 2, the microlens on the color filter has a height determined by the first gap, the second gap and the third gap.

6. The image sensor as claimed in claim 2, the microlens on the color filter has a slope determined by the first gap, the second gap and the third gap.

7. The image sensor as claimed in claim 2, wherein the transparent material is filled into each of the first gap, the second gap and the third gap.

8. The image sensor as claimed in claim 1, wherein the color filter is polygonal or rectangular.

9. The image sensor as claimed in claim 1, wherein the microlens comprises photoresist or thermoplastic resins.

10. An image sensor, comprising:
    a pixel sensor;
    a color filter array comprising a plurality of color filters formed on the pixel sensor, wherein two adjacent color filters have a gap therebetween and the color filter in the plurality of color filters comprises a first gap along a row direction, a second gap along a column direction and a third gap along a diagonal direction; and
    a gapless microlens array of a transparent material comprising a plurality of microlenses formed on the color filter array and the transparent material filled into the first gap, the second gap and the third gap,
    wherein the microlens on the color filter has a height and a slope determined by the first gap, the second gap and the third gap.

* * * * *